United States Patent
McCloskey et al.

(10) Patent No.: US 6,560,745 B1
(45) Date of Patent: May 6, 2003

(54) METHOD OF IDENTIFYING BOUNDARY OF MARKERLESS CODEWORD

(75) Inventors: Joseph P. McCloskey, Columbia, MD (US); Eric V. York, Severn, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 482 days.

(21) Appl. No.: 09/626,364

(22) Filed: Jul. 21, 2000

(51) Int. Cl.$^7$ ............................................. H03M 13/00
(52) U.S. Cl. ........................ 714/775; 714/752; 714/798; 375/145; 375/149; 340/825.2
(58) Field of Search ........................... 714/752, 8, 798, 714/775; 375/94, 341, 8; 340/347 DD; 371/47.1; 370/8

(56) References Cited

U.S. PATENT DOCUMENTS

| 4,375,102 A | * | 2/1983 | Van Daal | ..................... | 375/94 |
| 4,389,636 A | | 6/1983 | Riddle | | |
| 4,616,211 A | * | 10/1986 | Ross et al. | ........... | 340/347 DD |
| 4,959,834 A | | 9/1990 | Aikawa | | |
| 5,761,249 A | | 6/1998 | Ben-Efraim | | |

OTHER PUBLICATIONS

Bai–Jue Shie and Chen–Yi Lee, An Efficient VLC Decompression Scheme for User–defined Coding Tables, Mar. 1999, IEEE, pp. 1961–1962.*

* cited by examiner

Primary Examiner—Albert Decady
Assistant Examiner—Dipakkumar Gandhi
(74) Attorney, Agent, or Firm—Robert D. Morelli

(57) ABSTRACT

The present invention is a method of determining codeword boundary without marker bits by receiving transmission bits; determining a dual code of a code used to generate the transmission bits; selecting a vector from the dual code; initializing n scoring variables; initializing i=1; initializing z=1; selecting n bits from the transmission bits starting at bit position i; performing a bit-wise AND operation on the vector and the n selected bits; if the result of the bit-wise AND operation contains an even number of ones then assigning a value of zero to the result, otherwise assigning a value of one to the result; setting $S_z$ equal to $S_z$ plus the result of the last step; if z is less than n, incrementing z and i each by 1 and returning to the seventh step, otherwise proceeding to the next step; if z=n, i<L, and it is desired to process additional transmission bits then incrementing i by 1, and returning to the sixth step, otherwise proceeding to the next step; identifying the scoring variable $S_z$ having the lowest score; and identifying the subscript z of the result of the last step as the codeword boundary.

4 Claims, 1 Drawing Sheet

METHOD OF IDENTIFYING BOUNDARY OF MARKERLESS CODEWORD

FIELD OF THE INVENTION

The present invention relates, in general, to error detection/correction and fault detection/recovery, and, in particular, to digital data error correction using forward correction by block code for determining synchronization.

BACKGROUND OF THE INVENTION

To encode a signal of a user-definable length using forward error correction, a user first determines the number of bits k of the signal that will be encoded per codeword. The variable k is often referred to as the number of information bits per codeword.

Next, the user determines the length n of the codewords. Each codeword is the same length. The length of the codeword determines the amount of redundancy that is added to the information bits. The values of the redundant bits are a function of the information bits and, therefore, provide information on the true value of the information bits. Therefore, the redundant bits may be used to determine the true value of the information bits and, therefore, correct the information bit if the information bit is not the true value. The amount of redundancy introduced into a codeword is proportional to the number of errors that may be corrected. An error in a codeword is a bit in the codeword that is not correct (i.e., a 0 when it should be a 1, or vice versa). Typically, errors are introduced into a codeword during the transmission of the codeword. The source of the error is often equipment malfunction or noise in the transmission channel. Greater redundancy provides greater information on the true value of the information bits and, therefore, provides lesser dependence on any single bit for the true value of an information bit. A lesser dependence on a single bit for the true value of an information bit increases the number of errors that can be withstood (i.e., corrected) by the codeword.

Next, the user selects a k by n generator matrix G. Procedures exist for each prior art encoding scheme for selecting a generator matrix once k and n have been established.

Next, the user selects k bits from the signal to be encoded and multiplies these bits by the generator matrix G to produce an n-bit codeword. If k is 3 and n is 6 then G is a 3×6 matrix, where 3 signal bits will be used to generate each codeword, and each codeword will be 6 bits long. In this example, 3 information bits are encoded to form a 6-bit codeword. So, the codeword contains 3 redundant bits that may be used to determine the true values of the 3 signal bits even in the presence of a certain maximum number of errors introduced into the codeword. For example, a signal to be encoded is 001010011100101110111, where k is 3, n is 6 and G is as follows.

$$G = \begin{bmatrix} 1 & 0 & 0 & 1 & 0 & 1 \\ 0 & 1 & 0 & 1 & 1 & 0 \\ 0 & 0 & 1 & 0 & 1 & 1 \end{bmatrix}$$

The signal is then divided into 3-bit segments (i.e., 001, 010, 011, 100, 101, 110, and 111). Each segment is then multiplied by G to form the following 6-bit codewords, respectively: 001011, 010110, 01110101, 10001, 101110, 110011, and 111000.

The generator matrix G, which is based on k and n, sets the maximum number of errors that the codeword generated therefrom can withstand.

The bit location at which a codeword begins is referred to as a codeword boundary. The receiver that will receive an encoded signal must know where is the codeword boundary in order to properly identify the bits of each codeword. Once the codeword boundary is known then the codewords may be decoded to recover the unencoded signal.

A prior art method of determining codeword boundary is to insert a known bit pattern, or marker, between the codewords prior to transmission. The receiver, which must know beforehand what is the marker, checks the received transmission for occurrences of the marker and assumes that each occurrence indicates a codeword boundary. The codewords are then identified and decoded accordingly. A first disadvantage of this method is that adding a marker between each codeword requires more bits to be transmitted and, therefore, reduces the effective transmission rate of the codewords. For example, if a marker is equal to the length of a codeword then half of the bits transmitted correspond to markers and half of the bits transmitted correspond to codewords. So, the codeword transmission rate for this example is half that of transmitting codewords without markers. A second disadvantage of this method is that an error in a marker may cause a codeword boundary to not be recognized as such and, therefore, cause the received transmission to be decoded improperly. A prior art method of lessening the effect of the second disadvantage is to add error correction to the marker. Adding error correction to a marker increases its bit length and, therefore, further reduces the codeword transmission rate.

U.S. Pat. No. 4,389,636, entitled "ENCODING/DECODING SYNCHRONIZATION TECHNIQUE," discloses a device for and method of synchronization that encodes each signal bit as a complementary-bit-pair. Encoding each signal bit as a complementary-bit-pair reduces the codeword transmission rate and does not achieve the maximum codeword transmission rate as does the present invention which does not encode each signal bit as a complementary-bit-pair. U.S. Pat. No. 4,389,636 is hereby incorporated by reference into the specification of the present invention.

U.S. Pat. No. 4,959,834, entitled "WORD SYNCHRONIZATION SYSTEM AND METHOD," discloses a device for and method of synchronization that calculates a syndrome, sends synchronization pulses, changes the phase of the received signal, and recalculates the syndrome if the first syndrome calculation is not as expected (i.e., zero). The present invention does not calculates a syndrome, send synchronization pulses, and change the phase of the received signal as does U.S. Pat. No. 4,959,834. U.S. Pat. No. 4,959,834 is hereby incorporated by reference into the specification of the present invention.

U.S. Pat. No. 5,761,249, entitled "SYNCHRONIZATION ARRANGEMENT FOR DECODER/DE-INTERLEAVER," discloses a device for and method of synchronization that requires the inclusion of periodic decoder synchronization signals in the received signal (i.e., markers). The present invention does not require the inclusion of a marker to indicate codeword boundary. U.S. Pat. No. 5,761,249 is hereby incorporated by reference into the specification of the present invention.

SUMMARY OF THE INVENTION

It is an object of the present invention to determine the codeword boundary of an encoded signal transmitted without marker bits for indicating codeword boundary.

It is another object of the present invention to determine the codeword boundary of an encoded signal transmitted without marker bits for indicating codeword boundary by calculating a dot product of at least one codeword and at least one vector of a dual of the code used to encode the signal.

It is another object of the present invention to determine the codeword boundary of an encoded signal transmitted without marker bits for indicating codeword boundary by calculating a dot product of at least one codeword and at least one vector of a dual of the code used to encode the signal even if the encoded signal includes more errors than the code was designed to withstand.

The present invention is a method of determining the starting bit position of a codeword (i.e., the codeword boundary) that does not require the use of marker bits to identify the codeword boundary.

The first step of the method is receiving a plurality of transmission bits. The transmission bits include at least one codeword.

The second step of the method is determining the dual code of a code used to generate the at least one codeword in the transmission bits.

The third step of the method is selecting a vector from the dual code, excluding an all-zeros vector.

The fourth step of the method is initializing n scoring variables $S_z$ each to zero, where $1 \leq z \leq n$.

The fifth step of the method is initializing i=1.

The sixth step of the method is initializing z=1.

The seventh step of the method is selecting n bits from the received transmission bits $t_i$ for processing, starting at bit position i.

The eighth step of the method is performing an AND operation on the vector selected and the n bits selected from the received transmission bits on a bit-by-bit basis without any carry over from one bit position to another. This is commonly referred to as a bit-wise AND operation.

If the result of the eighth step contains an even number of ones then the ninth step of the method is assigning a value of zero to the result of the last step. Otherwise assigning a value of one to the result of the last step. The eighth step is commonly referred to as a dot product.

The tenth step of the method is setting $S_z$ equal to $S_z$ plus the result of the ninth step.

If the present value of z is less than n, the eleventh step of the method is incrementing z and i each by 1 and returning to the seventh step. Otherwise, proceeding to the next step.

If z=n, i<L, and it is desired to process additional transmission bits then the twelfth step is incrementing i by 1, and returning to the sixth step. Otherwise proceeding to the next step.

The thirteenth step of the method is identifying the scoring variable $S_z$ having the lowest score.

The fourteenth, and last, step of the method is identifying the subscript z of the result of the thirteenth step as the codeword boundary.

DETAILED DESCRIPTION

Figure 1:
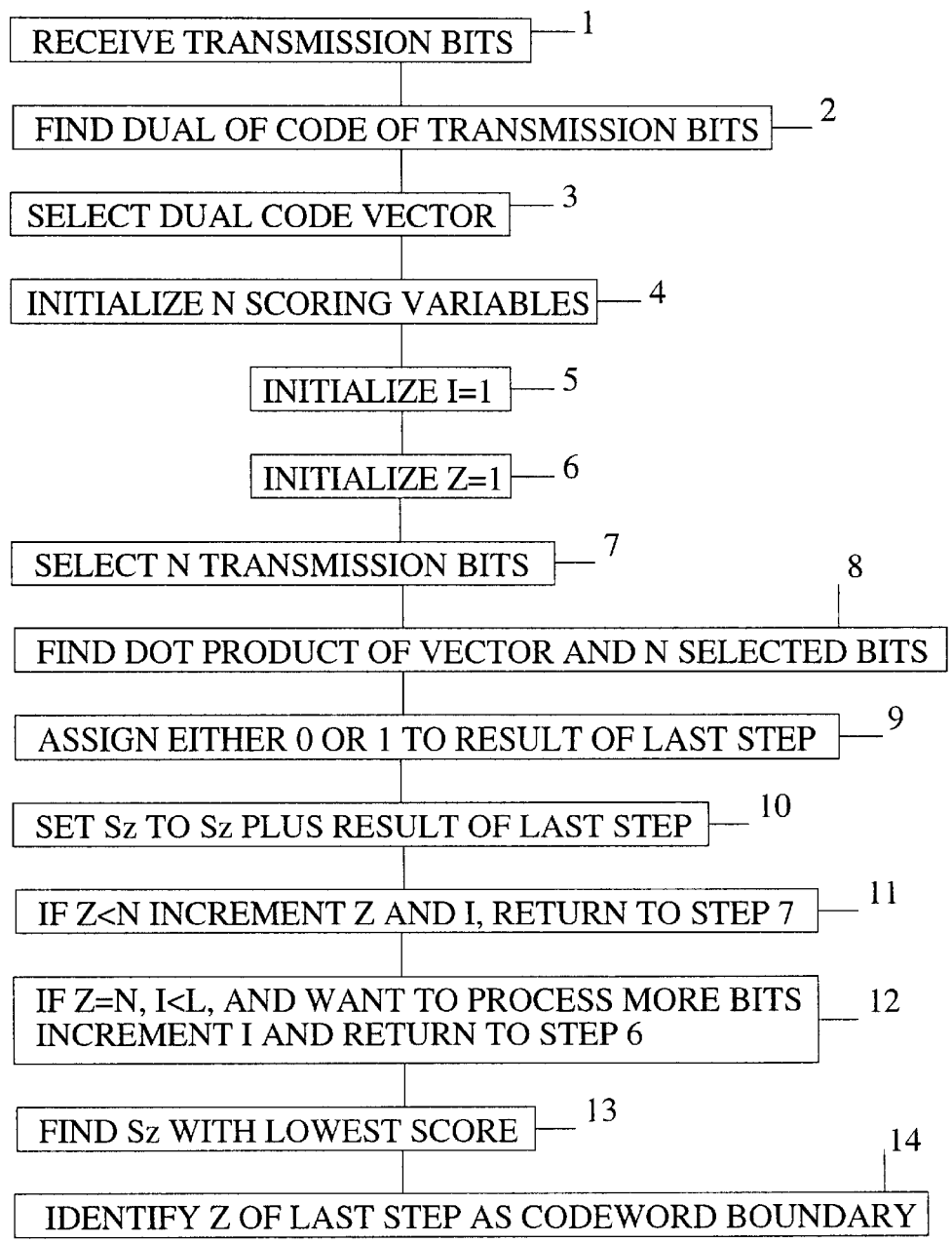
FIG. 1 is a list of the steps of the present invention.

The present invention is a method of determining the starting bit position of a codeword (i.e., the codeword boundary) that does not require the use of marker bits to identify the codeword boundary. By not including marker bits between codewords, codewords may be transmitted in the fewest number of clock periods and, therefore, at the maximum codeword transmission rate. Determining the codeword boundary is useful for synchronization purposes (i.e., proper identification, and decoding, of codewords). The present method derives the codeword boundary from the codewords and not from marker bits as does the prior art.

FIG. 1 is a list of the steps of the present method.

The first step 1 of the method is receiving a plurality of transmission bits $t_i$, where i indicates bit position, where $1 \leq i \leq L$, and where L is the bit length of the transmission bits. The transmission bits include at least one codeword, where each at least one codeword is n-bits long and includes k signal bits. The code used to generate the codewords may be selected from the group of codes consisting of a block code, a product code, a cyclic block code, a Hamming code, a BCH code, a CRC code, a Fire code, a Golay code, a Reed-Solomon code, or any other suitable code.

A product code consists of several component block codes. Turbo decoding is a method used to decode encoded signals in very noisy environments. Turbo product codes refer to product codes that use turbo decoding. The present invention is well suited for product codes, and works well in noisy environments, and therefore is best suited for a turbo product code.

The second step 2 of the method is determining the dual code of a code used to generate the at least one codeword in the transmission bits, where the dual code is described as a set of vectors. The dual code is a dual of the generator matrix G used to generate the codewords. The receiver must know beforehand what generator matrix G was used to generate the transmission bits. The variables k and n used to select the generator matrix G also establish the number of vectors in the dual code as $2^{n-k}$ and the length of each vector in the dual code as n. One of the vectors in the dual code is a vector that contains all zeros. Since the all zeros vector does not produce any useful results in the present invention, the all zeros vector is not used and, therefore, the number of useful vectors in the dual code is ($2^{n-k}-1$). For example, the dual code of the generator matrix G described in the background section, where k=3 and n=6, where the number of useful vectors is ($2^{6-3}-1$)=7, is as follows: 110100, 011010, 101001, 101110, 011101, 110011, and 000111.

The third step 3 of the method is selecting a vector from the dual code, excluding an all-zeros vector. For most transmission bits received, the codeword boundary may be found using one vector from the dual code. However, more than one vector may be used to determine the codeword boundary. If fact, it is possible to use all $2^{n-k}-1$ vectors in the dual space. Using more than one vector increases the confidence level that the codeword boundary determined by the method is correct. Using more than one vector is also useful for finding the correct codeword boundary when the transmission bits received contain many errors, even more errors than the generator matrix G was designed to withstand.

The fourth step 4 of the method is initializing n scoring variables $S_z$ each to zero, where $1 \leq z \leq n$. Each scoring variable, which corresponds to a bit position in a segment selected from the received transmission bits, is a counter for accumulate scores. The bit position in the segment selected from the received transmission bits with the corresponding scoring variable with the lowest score after a user-definable number of received transmission bits are processed is determined to be the codeword boundary (i.e., the bit position in each n-bit segment selected from the received transmission bits at which a codeword begins).

The fifth step 5 of the method is initializing i=1. By initializing i to 1, processing of the received transmission bits starts at the first bit received. In an alternate embodiment, processing may start at a different bit position than the first bit received. The alternate embodiment is useful in situations where the first x bits of the received transmission bits are believed to be corrupted.

The sixth step 6 of the method is initializing z=1. The variable z indicates the bit position of the bit being processed in an n-bit segment selected from the transmission bits. Per outer loop of the present method, 2n−1 transmission bits are processed in n groups of n-bits (i.e., processed in segments that are equal in length to a codeword), where each successive group of n bits is slide one bit position from the previous group of n bits. The present invention includes an inner loop and an outer loop. For each pass through the inner loop, one group of n-bits is processed. For each pass through the outer loop, n passes are made through the inner loop. The variable z not only indicates which bit in a group of n bits is being processed but also when the last group of n bits in a group of 2n−1 transmission bits has been processed and, therefore, when processing on another group of 2n−1 transmission bits may begin if the user-desires to process additional transmission bits. The present method does not require that all of the received transmission bits be processed. However, confidence in the result of the present method is proportional to the number of transmission bits processed (i.e., the more transmission bits processed, the greater the confidence in the result). However, processing additional transmission bits takes additional processing time and does not necessarily result in a linear increase in the confidence level. That is, at some point the confidence level will reach a plateau. Processing additional transmission bits after a plateau has been reached is a waste of time. So, the user must weigh desired confidence level and expected number of errors against processing time to determine how many passes through the present invention the user wishes to make in order to determine the codeword boundary. One pass through the outer loop of the present invention results in the processing of 2n−1 transmission bits, in groups of n bits. In the preferred embodiment, the user may halt processing after a pass through the outer loop has been completed. However, in an alternate embodiment, the user may halt processing after a pass through the inner loop has been completed.

Upon completion of a pass through the outer loop, the present method returns to the sixth step 6 if it is desired to process additional bits of the received transmission. Looping back to the sixth step 6 resets z which acts as a counter for indicating which bit is being processed in the next group of transmission bits and when the last group of n bits in that group has been reached.

The seventh step 7 of the method is selecting n bits from the received transmission bits $t_i$ for processing, starting at bit position i. The received transmission bits are processed in groups, where each group is equal in length to a codeword. A group selected may either include one complete codeword or bits from two different codewords. The user determines how many n-bit groups of transmission bits the present method will process in order to determine the bit position at which a codeword starts (i.e., the codeword boundary) within each n-bit group selected from the transmission bits.

The inner loop of the present invention which is described below causes the present method to return to the seventh step 7 for processing of another n-bit group of transmission bits. For each pass through the outer loop, n passes through the inner loop are made so that a total of n groups of n consecutive transmission bits (i e., 2n−1 total bits) are processed, where each successive group of n bits is slide by one bit position from the previous group of n bits. That is, each subsequently selected group of n bits starts at the second bit position of the previously selected group of n bits. During one pass though the outer loop of the present invention, each group of n-bits selected in the seventh step 7 will be combined, via a bit-wise AND operation, with the vector selected from the dual code as described in the next step.

The eighth step 8 of the method is performing a bit-wise AND operation on the vector selected and the n bits selected from the received transmission bits $t_i$ without any carry over to another bit position. The vector selected may be the vector selected in the third step 3, which is the first vector selected, but it may also be another vector selected after the first selected vector has been fully utilized. Any number of vectors in the dual code determined in the second step 2, excluding the all-zeros vector, may be selected and used in the present method. The following is an example of a bit-wise AND operation.

$$011010$$
$$001011$$
$$\ldots$$
$$001010$$

Whenever all zeros or an even number of ones result from a bit-wise AND operation, a zero will be assigned to the result. Assigning a value to the result of the bit-wise AND operation described above is commonly referred to as a dot product. Since a codeword is the product of k signal bits and a generator matrix G, the bit-wise AND of an n-bit error-free codeword selected from the received transmission and any vector in the corresponding dual code is a vector having either all zeros or an even number of ones. However, the product of n error-free bits selected from the received transmission, where the n bits contain bits from two different codewords, and any vector in the corresponding dual code is a vector having an odd number of ones with probability P, and having an even number of ones with probability (1−P). The probability P is determined by the encoded data and the vector chosen from the dual code. A result of all zeros, or an even number of ones, when the selected transmission bits are error free, indicates that the first bit of the selected transmission bits is a candidate for the first bit (i.e., the codeword boundary) of a codeword. A result of an odd number of ones, when the selected transmission bits are error free, indicates that the first bit of the selected transmission bits is not the first bit of a codeword. The effect of errors in the received transmission bits on a bit-wise AND operation cannot always be predicted. However, the effects of an error can be reduced, or totally eliminated, by processing additional transmission bits in groups of n bits and/or using more vectors from the dual code.

If the result of the eighth step 8 contains an even number of ones then the ninth step 9 of the method is assigning a value of zero to the result of the eighth step 8, otherwise assigning a value of one to the result of the eighth step 8. The ninth step 9 assigns a different value to each of the two possible results of the eighth step 8.

The tenth step 10 of the method is setting $S_z$ equal to $S_z$ plus the result of the ninth step 9. The tenth step 10 tallies a score for the $z^{th}$ bit position in each n-bit group of transmission bits selected. The tally $S_z$ for each bit position in an n-bit group selected from the transmission bits is not reset upon subsequent passes through the outer loop of the present invention. Each tally is cumulative. To accomplish this, the subscript z is reset upon each subsequent pass through the outer loop. If the received transmission is error free, the tally for the bit position that is the first bit of the codeword (i.e., the codeword boundary) will be zero while the tallies for the bit positions that are not a codeword boundary increase with the number of n-bit groups of transmission bits selected for processing. Each error may or may not result in a misleading value added to the tally of the affected bit. However, the detrimental affects of an error may be reduced, or eliminated, by processing additional n-bit groups of transmission bits or processing the same transmission bits using at least one other vector from the dual code. Errors may cause no detrimental effect on a tally, may cause a tally to be incremented when it should remain the same, or may cause a tally to remain the same when it should be incremented. Since the percentage of errors in an encoded transmission having any chance of being decode is much lower than the percentage of correct transmission bits, the tally of an error-effected codeword boundary bit grows at a slower rate than does the other tally bits. So, if a sufficient number of n-bit groups of transmission bits are processed, or more vectors are used from the dual space, the tally for the codeword boundary bit will be much smaller than the tallies for the other bit positions. The present invention can determine codeword boundary even if the errors in the received transmission bits exceed the number of errors for which the code used to encode the transmission bits was designed to withstand.

If the present value of z is less than n, the eleventh step 11 of the method is incrementing z and i each by 1 and returning to the seventh step 7. Otherwise, proceeding to the next step. The eleventh step 11 tests to see if another pass through the inner loop must be made. If so, return to the seventh step 7. If not, continue to the next step.

If z=n, i<L, and it is desired to process additional transmission bits then the twelfth step 12 is incrementing i by 1, and returning to the sixth step 6. Otherwise proceeding to the next step. The twelfth step 12 tests to see if a pass through the outer loop has been completed and if another pass through the outer loop should be made. If a pass through the outer loop has been completed, the end of the transmission bits has not been reached, and it is desired to process additional transmission bits then return to the sixth step 6 for another pass through the outer loop. Otherwise, proceed to the next step.

The thirteenth step 13 of the method is identifying the scoring variable $S_z$ having the lowest score.

The fourteenth, and last, step 14 of the method is identifying the subscript z of the result of the thirteenth step 13 as the codeword boundary. The subscript z is the bit position at which a codeword starts in each n-bit group selected from the transmission bits.

Here is an example that illustrates the major steps of the present method. The first step is to receive a plurality of transmission bits. For this example, the transmission bits received are 010110101100111011001101110 and were encoded using the generator matrix G described in the background section. To keep the calculations to a reasonable number while still illustrating the steps of the present method, it is assumed that the transmission is error free. By making this assumption, the codeword boundary may be identified as soon as there is only one scoring variable left that has a value of zero. If the transmission includes errors then a sufficient number of steps of the method must be performed to separate one scoring variable as having the lowest score from the other scoring variables. The numerical distance required between the lowest scoring variable and the other scoring variables is user-definable.

The second step is to determine the dual code of the code used to encode the transmission bits. Since the code used to encode the transmission bits is the generator matrix G described in the background section then the dual code is the dual code described above.

The third step is selecting a vector from the dual code. For this example, the fourth vector 101110 is selected.

The fourth step is initializing n scoring variable $S_z$ each to zero. Since the n used to establish the generator matrix is 6, $S_1, S_2, S_3, S_4, S_5$, and $S_6$ are each initialized to zero.

The fifth step is initializing i=1.

The sixth step is initializing z=1.

The seventh step is selecting 6 bits from the transmission bits starting at bit position i=1 (i.e., 010110).

The eighth step is performing a bit-wise AND operation on the vector 101110 and the transmission bits 010110, which is 000110.

Since there is an even number of ones in the result of the last step then the ninth step is to assign a zero to the result of the last step.

The tenth step is to add the result of the last step to the present value of $S_1$, (i.e., $S_1$=0+0=0).

Since z=1 and 1<6 then the eleventh step is to increment z and i each to 2 and return to the seventh step. This completes the first pass through the inner loop of the present invention.

The second application of the seventh step is selecting 6 bits from the transmission bits starting at bit position i=2 (i.e., 101101).

The second application of the eighth step is performing a bit-wise AND operation on the vector 101110 and the transmission bits 101101, which is 101100.

Since there is an odd number of ones in the result of the last step then the second application of the ninth step is to assign a one to the result of the last step.

The second application of the tenth step is to add the result of the last step to the present value of $S_2$, (i.e., $S_2$=0+1=1).

Since z=2 and 2<6 then the second application of the eleventh step is to increment z and i each to 3 and return to the seventh step. This completes the second pass through the inner loop of the present invention.

The third application of the seventh step is selecting 6 bits from the transmission bits starting at bit position i=3 (i.e., 011010).

The third application of the eighth step is performing a bit-wise AND operation on the vector 101110 and the transmission bits 011010, which is 001010.

Since there is an even number of ones in the result of the last step then the third application of the ninth step is to assign a zero to the result of the last step.

The third application of the tenth step is to add the result of the last step to the present value of $S_3$, (i.e., $S_3$=0+0=0).

Since z=3 and 3<6 then the third application of the eleventh step is to increment z and i each to 4 and return to the seventh step. This completes the third pass through the inner loop of the present invention.

The fourth application of the seventh step is selecting 6 bits from the transmission bits starting at bit position i=4 (i.e., 110101).

The fourth application of the eighth step is performing a bit-wise AND operation on the vector 101110 and the transmission bits 110101, which is 100100.

Since there is an even number of ones in the result of the last step then the fourth application of the ninth step is to assign a zero to the result of the last step.

The fourth application of the tenth step is to add the result of the last step to the present value of $S_4$, (i.e., $S_4=0+0=0$).

Since z=4 and 4<6 then the fourth application of the eleventh step is to increment z and i each to 5 and return to the seventh step. This completes the fourth pass through the inner loop of the present invention.

The fifth application of the seventh step is selecting 6 bits from the transmission bits starting at bit position i=5 (i.e., 101011).

The fifth application of the eighth step is performing a bit-wise AND operation on the vector 101110 and the transmission bits 101011, which is 101010.

Since there is an odd number of ones in the result of the last step then the fifth application of the ninth step is to assign a one to the result of the last step.

The fifth application of the tenth step is to add the result of the last step to the present value of $S_5$, (i.e., $S_5=0+1=1$).

Since z=5 and 5<6 then the fifth application of the eleventh step is to increment z and i each to 6 and return to the seventh step. This completes the fifth pass through the inner loop of the present invention.

The sixth application of the seventh step is selecting 6 bits from the transmission bits starting at bit position i=6 (i.e., 010110).

The sixth application of the eighth step is performing a bit-wise AND operation on the vector 101110 and the transmission bits 010110, which is 000110.

Since there is an even number of ones in the result of the last step then the sixth application of the ninth step is to assign a zero to the result of the last step.

The sixth application of the tenth step is to add the result of the last step to the present value of $S_6$, (i.e., $S_6=0+0=0$).

Since z=6, 6=6, i=6, and 6<29 (i.e., the total number of transmission bits) then the first application of the twelfth step is to increment i to 7 and return to the sixth step if it is desired to process additional transmission bits. Since $S_1=0$, $S_2=1$, $S_3=0$, $S_4=0$, $S_5=1$, and $S_6=0$, it isn't clear which bit is the most probable codeword boundary. Therefore, additional transmission bits should be processed. This completes the first pass through the outer loop. Returning to the sixth step causes the outer loop to be entered for the second time.

The second application of the sixth step is initializing z=1.

The seventh application of the seventh step is selecting 6 bits from the transmission bits starting at bit position i=7 (i.e., 101100).

The seventh application of the eighth step is performing a bit-wise AND operation on the vector 101110 and the transmission bits 101100, which is 101100.

Since there is an odd number of ones in the result of the last step then the seventh application of the ninth step is to assign a one to the result of the last step.

The seventh application of the tenth step is to add the result of the last step to the present value of $S_1$, (i.e., $S_1=0+1=1$).

Since z=1 and 1<6 then the seventh application of the eleventh step is to increment z to 2 and i to 8 and return to the seventh step. This completes the first pass through the inner loop of the present invention for the second pass through the outer loop.

The eighth application of the seventh step is selecting 6 bits from the transmission bits starting at bit position i=8 (i.e., 011001).

The eighth application of the eighth step is performing a bit-wise AND operation on the vector 101110 and the transmission bits 011001, which is 001000.

Since there is an odd number of ones in the result of the last step then the eighth application of the ninth step is to assign a one to the result of the last step.

The eighth application of the tenth step is to add the result of the last step to the present value of $S_2$, (i.e., $S_2=1+1=2$).

Since z=2 and 2<6 then the eighth application of the eleventh step is to increment z to 3 and i to 9 and return to the seventh step. This completes the second pass through the inner loop of the present invention for the second pass through the outer loop.

The ninth application of the seventh step is selecting 6 bits from the transmission bits starting at bit position i=9 (i.e., 110011).

The ninth application of the eighth step is performing a bit-wise AND operation on the vector 101110 and the transmission bits 110011, which is 100010.

Since there is an even number of ones in the result of the last step then the ninth application of the ninth step is to assign a zero to the result of the last step.

The ninth application of the tenth step is to add the result of the last step to the present value of $S_3$, (i.e., $S_3=0+0=0$).

Since z=3 and 3<6 then the ninth application of the eleventh step is to increment z to 4 and i to 10 and return to the seventh step. This completes the third pass through the inner loop of the present invention for the second pass through the outer loop.

The tenth application of the seventh step is selecting 6 bits from the transmission bits starting at bit position i=10 (i.e., 100111).

The tenth application of the eighth step is performing a bit-wise AND operation on the vector 101110 and the transmission bits 100111, which is 100110.

Since there is an odd number of ones in the result of the last step then the tenth application of the ninth step is to assign a one to the result of the last step.

The tenth application of the tenth step is to add the result of the last step to the present value of $S_4$, (i.e., $S_4=0+1=1$).

Since z=4 and 4<6 then the tenth application of the eleventh step is to increment z to 5 and i to 11 and return to the seventh step. This completes the fourth pass through the inner loop of the present invention for the second pass through the outer loop.

The eleventh application of the seventh step is selecting 6 bits from the transmission bits starting at bit position i=11 (i.e., 001110).

The eleventh application of the eighth step is performing a bit-wise AND operation on the vector 101110 and the transmission bits 001110, which is 001110.

Since there is an odd number of ones in the result of the last step then the eleventh application of the ninth step is to assign a one to the result of the last step.

The eleventh application of the tenth step is to add the result of the last step to the present value of $S_5$, (i.e., $S_5=1+1=2$).

Since z=5 and 5<6 then the eleventh application of the eleventh step is to increment z to 6 and i to 12 and return to the seventh step. This completes the fifth pass through the inner loop of the present invention for the second pass through the outer loop.

The twelfth application of the seventh step is selecting 6 bits from the transmission bits starting at bit position i=12 (i.e., 011101).

The twelfth application of the eighth step is performing a bit-wise AND operation on the vector 101110 and the transmission bits 011101, which is 001100.

Since there is an even number of ones in the result of the last step then the twelfth application of the ninth step is to assign a zero to the result of the last step.

The twelfth application of the tenth step is to add the result of the last step to the present value of $S_6$, (i.e., $S_6=0+0=0$).

Since z=6, 6=6, i=12, and 12<29 then the second application of the twelfth step is to increment i to 13 and return to the, sixth step if it is desired to process additional transmission bits. Since $S_1=1$, $S_2=2$, $S_3=0$, $S_4=1$, $S_5=2$, and $S_6=0$, it isn't clear which bit is the most probable codeword boundary. Therefore, additional transmission bits should be processed. This completes the second pass through the outer loop. Returning to the sixth step causes the outer loop to be entered for the third time.

The third application of the sixth step is initializing z=1.

The thirteenth application of the seventh step is selecting 6 bits from the transmission bits starting at bit position i=7 (i.e., 111011).

The thirteenth application of the eighth step is performing a bit-wise AND operation on the vector 101110 and the transmission bits 111011, which is 101010.

Since there is an odd number of ones in the result of the last step then the thirteenth application of the ninth step is to assign a one to the result of the last step.

The thirteenth application of the tenth step is to add the result of the last step to the present value of $S_1$, (i.e., $S_1=1+1=2$).

Since z=1 and 1<6 then the thirteenth application of the eleventh step is to increment z to 2 and i to 14 and return to the seventh step. This completes the first pass through the inner loop of the present invention for the third pass through the outer loop.

The fourteenth application of the seventh step is selecting 6 bits from the transmission bits starting at bit position i=14 (i.e., 110110).

The fourteenth application of the eighth step is performing a bit-wise AND operation on the vector 101110 and the transmission bits 110110, which is 100110.

Since there is an odd number of ones in the result of the last step then the fourteenth application of the ninth step is to assign a one to the result of the last step.

The fourteenth application of the tenth step is to add the result of the last step to the present value of $S_2$, (i.e., $S_2=2+1=3$).

Since z=2 and 2<6 then the fourteenth application of the eleventh step is to increment z to 3 and i to 15 and return to the seventh step. This completes the second pass through the inner loop of the present invention for the third pass through the outer loop.

The fifteenth application of the seventh step is selecting 6 bits from the transmission bits starting at bit position i=15 (i.e., 101100).

The fifteenth application of the eighth step is performing a bit-wise AND operation on the vector 101110 and the transmission bits 101100, which is 101100.

Since there is an odd number of ones in the result of the last step then the fifteenth application of the ninth step is to assign a one to the result of the last step.

The fifteenth application of the tenth step is to add the result of the last step to the present value of $S_3$, (i.e., $S_3=0+1=1$).

Since z=3 and 3<6 then the fifteenth application of the eleventh step is to increment z to 4 and i to 16 and return to the seventh step. This completes the third pass through the inner loop of the present invention for the third pass through the outer loop.

The sixteenth application of the seventh step is selecting 6 bits from the transmission bits starting at bit position i=16 (i.e., 011001).

The tenth application of the eighth step is performing a bit-wise AND operation on the vector 101110 and the transmission bits 011001, which is 001000.

Since there is an odd number of ones in the result of the last step then the sixteenth application of the ninth step is to assign a one to the result of the last step.

The sixteenth application of the tenth step is to add the result of the last step to the present value of $S_4$, (i.e., $S_4=1+1=2$).

Since z=4 and 4<6 then the sixteenth application of the eleventh step is to increment z to 5 and i to 17 and return to the seventh step. This completes the fourth pass through the inner loop of the present invention for the third pass through the outer loop.

The seventeenth application of the seventh step is selecting 6 bits from the transmission bits starting at bit position i=17 (i.e., 110010).

The seventeenth application of the eighth step is performing a bit-wise AND operation on the vector 101110 and the transmission bits 110010, which is 100010.

Since there is an even number of ones in the result of the last step then the seventeenth application of the ninth step is to assign a zero to the result of the last step.

The seventeenth application of the tenth step is to add the result of the last step to the present value of $S_5$, (i.e., $S_5=2+0=2$).

Since z=5 and 5<6 then the seventeenth application of the eleventh step is to increment z to 6 and i to 18 and return to the seventh step. This completes the fifth pass through the inner loop of the present invention for the third pass through the outer loop.

The eighteenth application of the seventh step is selecting 6 bits from the transmission bits starting at bit position i=18 (i.e., 100101).

The eighteenth application of the eighth step is performing a bit-wise AND operation on the vector 101110 and the transmission bits 100101, which is 100100.

Since there is an even number of ones in the result of the last step then the eighteenth application of the ninth step is to assign a zero to the result of the last step.

The eighteenth application of the tenth step is to add the result of the last step to the present value of $S_6$, (i.e., $S_6=0+0=0$).

Since z=6, 6=6, i=18, and 18<29 then the third application of the twelfth step is to increment i to 16 and return to the sixth step if it is desired to process additional transmission bits. Since $S_1=2$, $S_2=3$, $S_3=1$, $S_4=2$, $S_5=2$, and $S_6=0$, it is clear that there is a most probable codeword boundary. Therefore, proceed to the next step.

The first application of the thirteenth step is identifying the scoring variable that has the lowest score (i.e., $S_6=0$).

The first application of the fourteenth step is identifying the subscript of the result of the last step (i.e., 6) as the codeword boundary. That is, every sixth bit in the received transmission bits is the start of a codeword. With this knowledge, the codewords in the transmission bits may be properly identified and properly decoded.

What is claimed is:

1. A method of determining codeword boundary without marker bits, comprising the steps of:
 a) receiving a plurality of transmission bits $t_i$, where i indicates bit position, where $1 \leq i \leq L$, where $t_i$ includes at least one codeword, where each at least one codeword includes k signal bits, and where each at least one codeword is n bits long;
 b) determining a dual code of a code used to generate the at least one codeword in $t_i$;
 c) selecting a first vector from the dual code, excluding an all-zeros vector;
 d) initializing n scoring variables $S_z$ each to zero, where $1 \leq z \leq n$;
 e) initializing i=1;
 f) initializing z=1;
 g) selecting n bits from $t_i$, starting at bit position i;
 h) performing a bit-wise AND operation on the vector selected and the n bits selected from $t_i$;
 i) if the result of step (h) contains an even number of ones then assigning a value of zero to the result of step (h), otherwise assigning a value of one to the result of step (h);
 j) setting $S_z$ equal to $S_z$ plus the result of step (i);
 k) if z is less than n, incrementing z and i each by 1 and returning to step (g), otherwise proceeding to the next step;
 l) if z=n, i<L, and it is desired to process additional transmission bits then incrementing i by 1, and returning to step (f), otherwise proceeding to the next step;
 m) identifying the scoring variable $S_z$ having the lowest score; and
 n) identifying the subscript z of the result of step (m) as the codeword boundary.

2. The method of claim 1, wherein said step of receiving a plurality of transmission bits is comprised of the step of receiving a plurality of transmission bits wherein the at least one codeword contained in the plurality of transmission bits was encoded using a code selected from the group of codes consisting of block code, product code, cyclic block code, Hamming code, BCH code, CRC code, Fire code, Golay code, and Reed-Solomon code.

3. The method of claim 2, further including the step of selecting a second vector from the dual code, and returning to step (e).

4. The method of claim 1, further including the step of selecting a second vector from the dual code, and returning to step (e).

* * * * *